(12) United States Patent
Yu

(10) Patent No.: US 12,700,862 B2
(45) Date of Patent: Aug. 4, 2026

(54) GRIP DETECTION DEVICE, FAILURE DETERMINATION METHOD, AND PROGRAM

(71) Applicant: Autoliv Development AB, Vargarda (SE)

(72) Inventor: Jae Woo Yu, Kanagawa (JP)

(73) Assignee: Autoliv Development AB, Vargarda (SE)

( * ) Notice: Subject to any disclaimer, the term of this patent is extended or adjusted under 35 U.S.C. 154(b) by 0 days.

(21) Appl. No.: 19/111,204

(22) PCT Filed: Sep. 1, 2023

(86) PCT No.: PCT/JP2023/032135
§ 371 (c)(1),
(2) Date: Mar. 12, 2025

(87) PCT Pub. No.: WO2024/057979
PCT Pub. Date: Mar. 21, 2024

(65) Prior Publication Data
US 2026/0088819 A1 Mar. 26, 2026

(30) Foreign Application Priority Data

Sep. 12, 2022 (JP) ................................. 2022-144688

(51) Int. Cl.
*H03K 17/96* (2006.01)
*B62D 1/04* (2006.01)

(52) U.S. Cl.
CPC ........... *H03K 17/962* (2013.01); *B62D 1/046* (2013.01); *H03K 2217/960705* (2013.01); *H03K 2217/960765* (2013.01)

(58) Field of Classification Search
CPC ................. H03K 17/96; H03K 17/962; H03K 2217/960705; H03K 2217/960765; B62D 1/046; B62D 1/04
See application file for complete search history.

(56) References Cited

FOREIGN PATENT DOCUMENTS

JP      2014-190856 A      10/2014
JP        2019-23011 A       2/2019
WO     2016/087203 A1      6/2016

*Primary Examiner* — Robert L Deberadinis
(74) *Attorney, Agent, or Firm* — Harness, Dickey & Pierce, P.L.C.; Ryan W. Massey

(57) ABSTRACT

A hands-on detection device of a steering wheel according to one embodiment of the present invention is a hands-on detection device of a steering wheel comprising: a core metal; a shield electrode provided outside the core metal and separated by an insulator (In); a sensor electrode further provided outside the shield electrode and separated by an insulator (In); and a control unit configured to acquire the capacitance value of the sensor electrode in a state in which the shield electrode and the core metal are short-circuited, and determine whether or not there is a failure based on the capacitance value.

8 Claims, 6 Drawing Sheets

FIG. 5

| FAILURE MODE | HANDS-ON STATE | CAPACITANCE VALUE |
|---|---|---|
| FAILURE FREE | HANDS-OFF | LARGE |
| FAILURE FREE | HANDS-ON | LARGE |
| SENSOR OPEN | HANDS-OFF | SMALL |
| SENSOR OPEN | HANDS-ON | SMALL |
| SHIELD OPEN | HANDS-OFF | SMALL |
| SHIELD OPEN | HANDS-ON | LARGE |
| SENSOR GROUND SHORT | HANDS-OFF | SMALL |
| SENSOR GROUND SHORT | HANDS-ON | SMALL |
| SHIELD GROUND SHORT | HANDS-OFF | LARGE |
| SHIELD GROUND SHORT | HANDS-ON | LARGE |
| SENSOR SHIELD SHORT | HANDS-OFF | SMALL |
| SENSOR SHIELD SHORT | HANDS-ON | SMALL |

GRIP DETECTION DEVICE, FAILURE DETERMINATION METHOD, AND PROGRAM

TECHNICAL FIELD

The present invention relates to a hands-on detection device, a failure determination method, and a program.

BACKGROUND ART

Conventionally, steering wheel units capable of diagnosing failures in capacitance sensors for detecting the hands-on state of a steering wheel have been disclosed. (For example, Patent Document 1)

RELATED ART DOCUMENTS

Patent Documents

Patent Document 1: JP 2019-23011 A

SUMMARY OF THE INVENTION

Problem to be Solved by the Invention

The steering wheel unit described in Patent Document 1 can diagnose a failure of the capacitance sensor only when the steering wheel is not gripped, but cannot diagnose a failure of the capacitance sensor when the steering wheel is gripped.

The present invention has been created in view of the abovementioned problem, with the object of providing a hands-on detection device, etc. capable of determining a failure regardless of whether the steering wheel is gripped or not.

Means for Solving the Problem

The hands-on detection device of a steering wheel according to one embodiment of the present invention is a hands-on detection device (1) of a steering wheel (2), comprising: a core metal (23); a shield electrode (22) provided outside the core metal (23) and separated by an insulator (In); a sensor electrode (21) further provided outside the shield electrode (22) and separated by an insulator (In); and a control unit (11) configured to acquire the capacitance value of the sensor electrode (21) in a state in which the shield electrode (22) and the core metal (23) are short-circuited, and determine whether or not there is a failure based on the capacitance value.

The hands-on detection device according to one embodiment of the present invention further comprises a first switch (13a) provided between the shield electrode (22) and the core metal (23), which is turned on to short-circuit the shield electrode (22) and the core metal (23), wherein the control unit (11) determines whether or not there is a failure while the first switch (13a) is turned on.

In the hands-on detection device according to one embodiment of the present invention, the control unit (11) determines that there is a failure state when the acquired capacitance value is less than a predetermined value.

The hands-on detection device according to one embodiment of the present invention further comprises an additional circuit (132) which is connected to the shield electrode (22), applies a voltage to the shield electrode (22), and measures the voltage value of the applied voltage, wherein, when the voltage value of the voltage applied by the additional circuit (132) is lower than a specified value, the control unit (11) determines that the shield electrode (22) and the core metal (23) are in a short-circuited failure state.

The hands-on detection device according to one embodiment of the present invention further comprises a second switch (13b) provided between the shield electrode (22) and the additional circuit (132) which, when turned on, enables electrical conduction between the shield electrode (22) and the additional circuit (132), wherein the control unit (11) determines whether or not the shield electrode (22) and the core metal (23) are short-circuited when the second switch (13b) is turned on.

In the hands-on detection device according to one embodiment of the present invention, the control unit (11) determines whether or not the steering wheel (2) is gripped when the second switch (13b) is turned on.

A failure determination method according to one embodiment of the present invention is a failure determination method for a hands-on detection device (1) of a steering wheel (2), the device comprising: a core metal (23); a shield electrode (22) provided outside the core metal (23) and separated by an insulator (In); and a sensor electrode (21) further provided outside the shield electrode (22) and separated by an insulator (In), the method comprising: acquiring the capacitance value of the sensor electrode (21) in a state in which the shield electrode (22) and the core metal (23) are short-circuited; and determining whether or not there is a failure based on the capacitance value.

A program according to one embodiment of the present invention is a program for determining a failure of a hands-on detection device (1) of a steering wheel (2), the device comprising: a core metal (23); a shield electrode (22) provided outside the core metal (23) and separated by an insulator (In); and a sensor electrode (21) further provided outside the shield electrode (22) and separated by an insulator (In), the program comprising: acquiring the capacitance value of the sensor electrode (21) in a state in which the shield electrode (22) and the core metal (23) are short-circuited; and determining whether or not there is a failure based on the capacitance value.

Effect of the Invention

The hands-on detection device according to one embodiment of the present invention enables failure determination regardless of whether the steering wheel is gripped or not gripped.

BRIEF DESCRIPTION OF THE DRAWINGS

FIG. 5 is a table illustrating capacitance values acquired by a capacitance sensor in each failure mode when a first switch is turned on.

DESCRIPTION OF THE PREFERRED EMBODIMENTS

Embodiments

Embodiments of the present invention will be described below with reference to the drawings.

Figure 1:
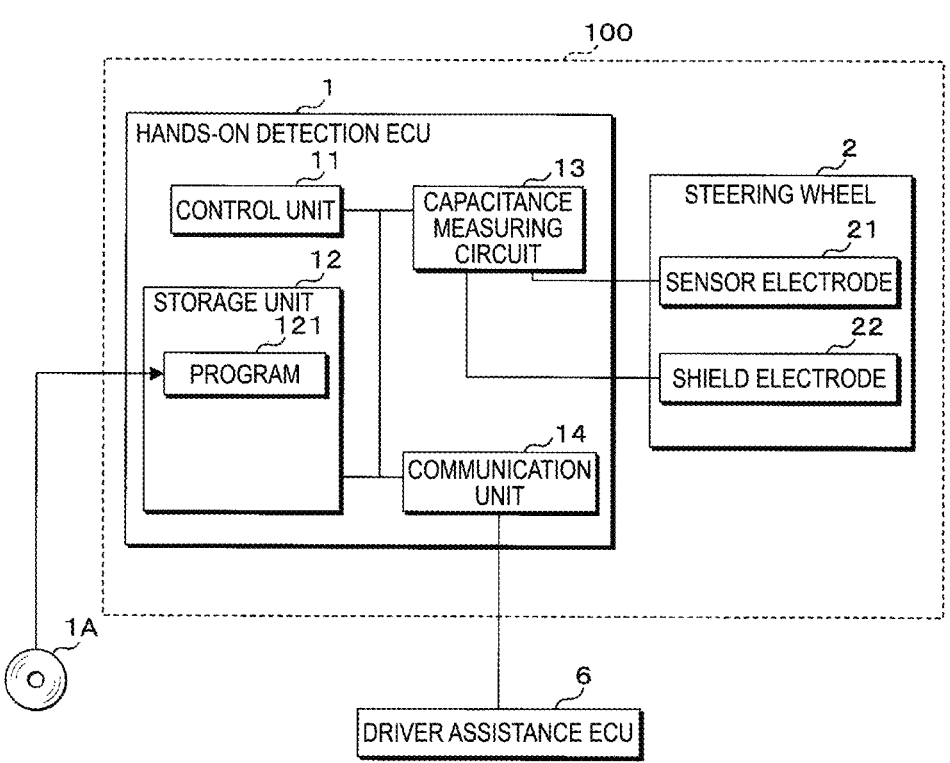
FIG. 1 is a block diagram depicting an example configuration of a steering wheel device according to the present embodiment.

FIG. 1 is a block diagram depicting an example configuration of a steering wheel device 100 according to the present embodiment. The steering wheel device 100 includes a hands-on detection ECU (Electronic Control Unit) 1 and a steering wheel 2. The hands-on detection ECU 1 corresponds to the hands-on detection device. The hands-on detection ECU 1 is communicatively connected to on-board equipment such as, for example, a driver assistance ECU 6 by an in-vehicle network installed in the vehicle.

Figure 2:
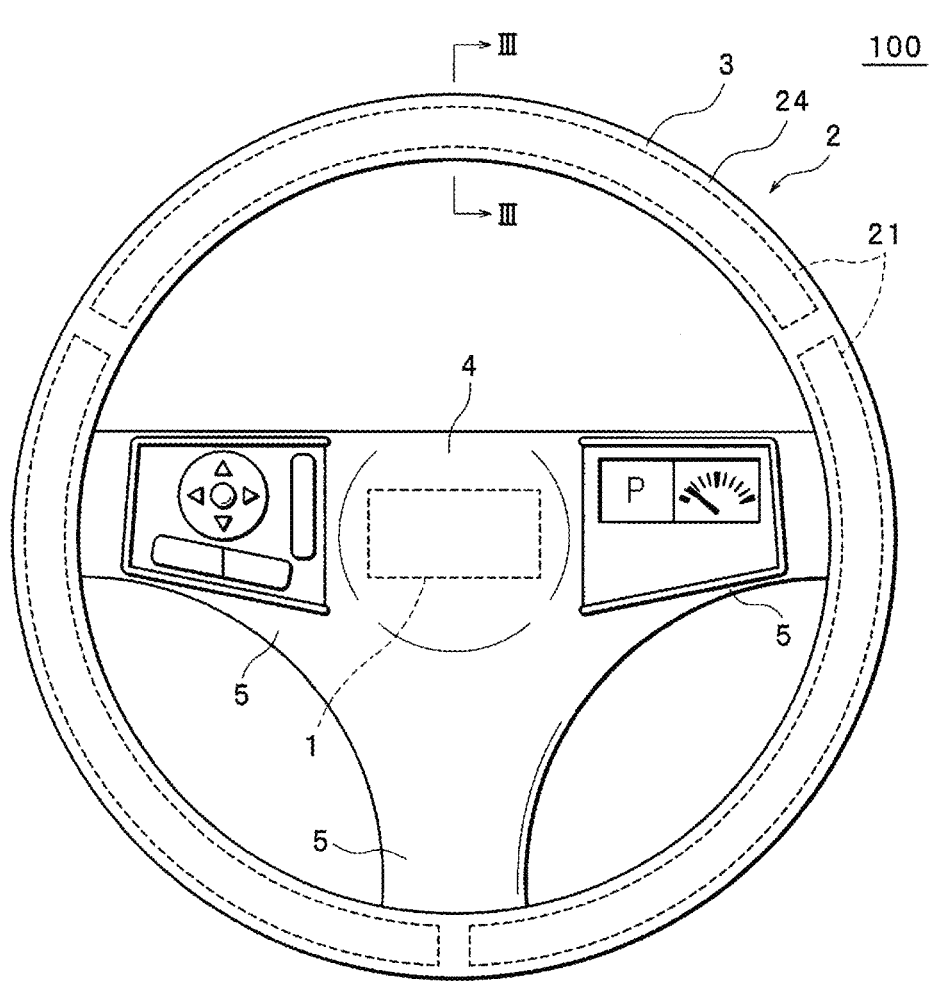
FIG. 2 is a front view of the steering wheel of the steering wheel device according to the present embodiment.

FIG. 2 is a front view of the steering wheel 2 of the steering wheel device 100 according to the present embodiment. The steering wheel 2 includes a circular shaped rim part 3 and a hub part 4 disposed in the center of the rim part 3. The hub part 4 has, for example, an airbag (not depicted) installed therein. The hub part 4 is connected to the rim part 3 by means of three spoke parts 5.

The rim part 3 is covered with a covering layer 24 such as leather, while the hub part 4 and spoke parts 5 are covered with, for example, a resin material. The rim part 3 is not limited to a circular ring shape, but may also be a non-circular shape (for example, a D-shape or a C-shape).

The sensor electrode 21 is provided inside of the rim part 3 along the circumferential direction of the rim part 3. The sensor electrode 21 is divided into three equal parts in the circumferential direction, with each part respectively embedded in the rim part 3. Note that the number of sensor electrodes 21 is not limited to three and may be two or less or four or more. The sensor electrode 21 forms a capacitor between with the below-mentioned shield electrode 22 and/or a human body in contact with the steering wheel 2, with the below-mentioned capacitance sensor 131 detecting the magnitude of capacitance (capacitance value) that changes depending on whether or not the human body is in contact with the steering wheel 2.

Figure 3:
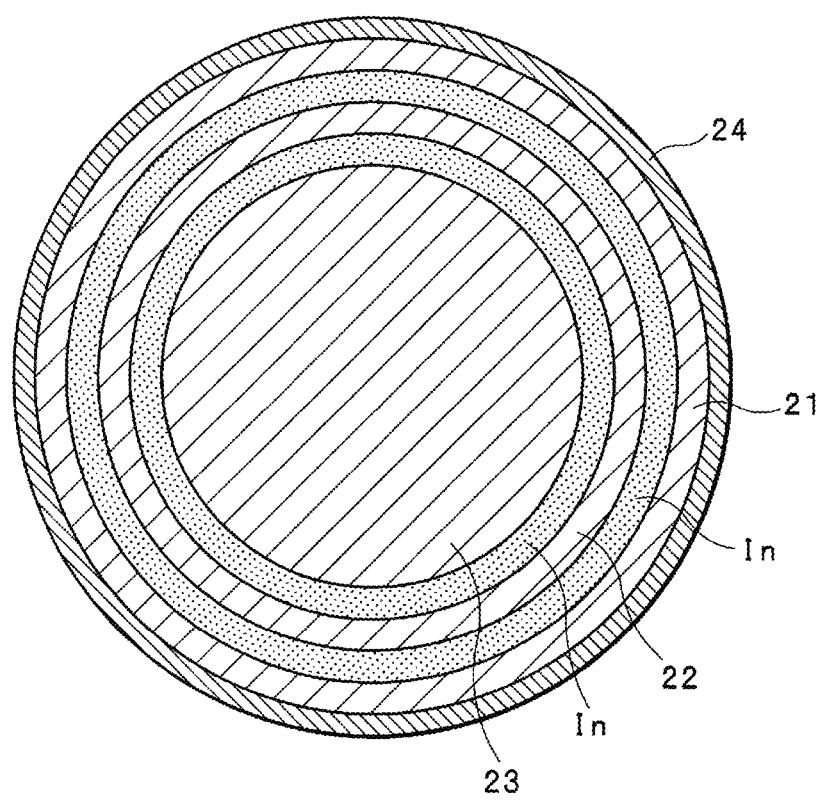
FIG. 3 is a cross-sectional view of a rim part of the steering wheel taken along the line III-III in FIG. 2.

FIG. 3 is a cross-sectional view of a rim part 3 of the steering wheel 2 taken along the line III-III in FIG. 2. A core metal 23 is provided at the center of the rim part 3. The shield electrode 22 is provided around the core metal 23 and separated by an insulator In. The sensor electrode 21 is further provided around the shield electrode 22 and separated by an insulator In. The outer side of the sensor electrode 21 is covered with a covering layer 24 such as leather.

As depicted in FIG. 1, the hands-on detection ECU 1 includes a control unit 11, a storage unit 12, a capacitance measurement circuit 13, and a communication unit 14.

The control unit 11 is a microcontroller, for example, including one or more processors using a central processing unit (CPU), a graphics processing unit (GPU), etc. The control unit 11 performs various control processes and calculation processes by reading and executing programs and data stored in the storage unit 12 or a ROM (Read Only Memory) using an internal clock, counter, and the like.

The storage unit 12 includes a non-volatile memory element such as a flash memory or an EEPROM (Electrically Erasable Programmable Read Only Memory). The storage unit 12 stores various programs and data to which the control unit 11 refers. In the present embodiment, the storage unit 12 stores a program 121 for causing a computer to execute processing related to hands-on detection (hands-on determination) and failure state determination (failure determination). Moreover, the storage unit 12 stores a predetermined value and a specified value used for failure determination, as well as a threshold value related to hands-on determination. The predetermined value, the specified value, and the threshold value will be described later.

The program (program product) stored in the storage unit 12 may be in a form recorded in a computer-readable manner on a recording medium. The storage unit 12 stores a program read from the storing media 1A by a read device (not depicted). The storing media 1A is, for example, a magnetic disk, an optical disk, a semiconductor memory, or the like. In addition, the program may be downloaded from an external server connected to a communication network (not depicted) and stored in the storage unit 12. The program 121 may be a single computer program or may be composed of multiple computer programs, and may be executed on a single computer or on multiple computers interconnected by a network.

The capacitance measurement circuit 13 is connected to the sensor electrode 21 and the shield electrode 22 of the steering wheel 2 and is an electrical circuit for measuring the capacitance of the sensor electrode 21. The control unit 11 acquires the capacitance value measured by the capacitance measurement circuit 13 and carries out hands-on detection based on the acquired capacitance value. Specifically, the control unit 11 determines whether the steering wheel 2 is in a hands-on state or a hands-off state (hands-on determination) by comparing the abovementioned capacitance value with a prescribed threshold value. Here, the hands-on state means a state in which the driver grips the steering wheel 2, while the hands-off state means a state in which the driver is not gripping and has their hands separated from the steering wheel 2.

The communication unit 14 is a communication interface for transmitting and receiving data to and from other on-board devices via the in-vehicle network. The communication unit 14 is connected to a Local Area Network (LAN) provided in-vehicle and transmits and receives information with the driver assistance ECU 6, etc. The communicating part 14 transmits the hands-on determination results based on the control unit 11 to the driver assistance ECU 6.

The driver assistance ECU 6 is an ECU for executing processing according to an advanced driver assistance system. The driver assistance ECU 6 receives a signal indicating grip determination results from the control unit 11 via the communicating part 14, then executes prescribed processing according to the advanced driver assistance system based on these hands-on determination results. For example, if hands-on determination results indicating a hands-off state of the steering wheel 2 are received from the control unit 11 during autonomous driving, the driver assistance ECU 6 terminates autonomous driving. Note that driver assistance ECU 6 processing is not limited to autonomous driving and may be lane keep assist, parking assist, etc.

Figure 4:
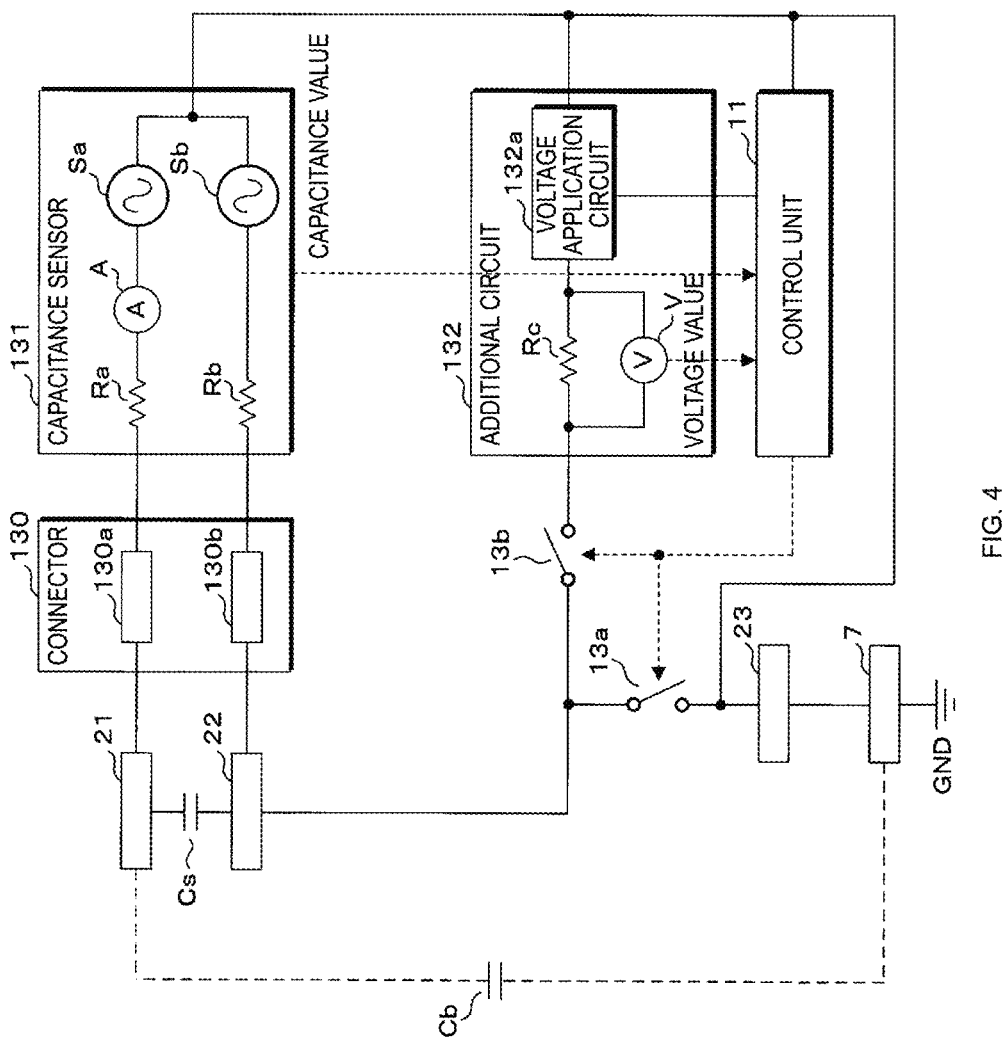
FIG. 4 is an explanatory diagram depicting a specific connection example of a capacitance measuring circuit, etc.

FIG. 4 is an explanatory diagram depicting a specific connection example of a capacitance measuring circuit 13, etc. The capacitance measurement circuit 13 includes a connector 130, a capacitance sensor 131, an additional circuit 132, a first switch 13a, and a second switch 13b. The connector 130 includes a sensor connector 130a connected to the sensor electrode 21 and a shield connector 130b connected to the shield electrode 22. The capacitance sensor 131 includes a resistor Ra connected to the sensor connector 130a, a resistor Rb connected to the shield connector 130b, an ammeter A connected to the resistor Ra, an AC power supply Sa connected to the ammeter A, and an AC power supply Sb connected to the resistor Rb. The AC power supply Sa and the AC power supply Sb apply the same voltage to the sensor electrode 21 and the shield electrode 22. The ammeter A measures the amount of current flowing from the AC power supply Sa to the sensor electrode 21, while the capacitance sensor 131 acquires the capacitance value of the sensor electrode 21 based on the amount of current measured by the ammeter A. Note that as the amount of current measured by the ammeter A increases, the capacitance value acquired by the capacitance sensor 131 increases.

The shield electrode 22 is connected to the core metal 23 having the same potential (GND potential) as the ground (GND) via the first switch 13*a*. When the first switch 13*a* is turned on, the shield electrode 22 and the metal core 23 become short-circuited and electrically conductive. Moreover, the shield electrode 22 is connected to the additional circuit 132 via the second switch 13*b*. When the second switch 13*b* is turned on, the shield electrode 22 and the additional circuit 132 become electrically conductive.

The additional circuit 132 includes a voltage application circuit 132*a*, a resistor Rc, and a voltmeter V. When the second switch 13*b* is turned on, the voltage application circuit 132*a* applies a voltage to the shield electrode 22. The voltmeter V acquires the voltage value applied to the shield electrode 22 by the voltage application circuit 132*a*.

The control unit 11 can acquire the capacitance value from the capacitance sensor 131 and acquire the voltage value from the voltmeter V. Moreover, the first switch 13*a* and the second switch 13*b* are switched on or off under the control of the control unit 11. Note that the control unit 11 turns on only one of the first switch 13*a* and the second switch 13*b*, but does not turn on both switches at the same time. In addition, the control unit 11 can control voltage application to the shield electrode 22 by the voltage application circuit 132*a*.

The sensor electrode 21 and the shield electrode 22 form a capacitor Cs with an insulator In provided therebetween. In a non-failure state (normal state), the same voltage is applied to both the sensor electrode 21 and the shield electrode 22. As a result, the sensor electrode 21 and the shield electrode 22 (capacitor Cs) are not electrically conductive. However, in a failure state, if a potential difference occurs between the sensor electrode 21 and the shield electrode 22, the capacitor Cs becomes electrically conductive.

The dashed lines illustrated in FIG. 4 indicate a circuit in a state in which the driver grips the steering wheel 2. When the driver grips the steering wheel 2, the sensor electrode 21 is electrically connected to a chassis 7 via the driver's body, the vehicle seat, or the air inside the vehicle. The chassis 7 is connected to GND and its potential is GND potential. Since the driver's body forms a capacitor Cb and has resistance, a capacitor Cb is not electrically conducted even in the hands-on state when there is another circuit having a low resistance value connected from the sensor electrode 21 to GND.

FIG. 5 is a table illustrating the capacitance values acquired by the capacitance sensor 131 in each failure mode when the first switch 13*a* is turned on. In this embodiment, the failure state includes five failure modes. The sensor open mode is a state in which the sensor electrode 21 and the sensor connector 130*a* are disconnected from each other and cannot be electrically conductive. The shield open mode is a state in which the shield electrode 22 and the shield connector 130*b* are disconnected from each other and cannot be electrically conductive. The sensor ground short mode is a state in which the sensor electrode 21 and the core metal 23 at GND potential are short-circuited. The shield ground short mode is a state in which the shield electrode 22 and the core metal 23 at GND potential are short-circuited. The sensor shield short mode is a state in which the sensor electrode 21 and the shield electrode 22 are short-circuited.

When the first switch 13*a* is turned on to short-circuit the shield electrode 22 and the core metal 23 in the hands-off state in which no failure occurs, the potential of the shield electrode 22 becomes GND potential and a potential difference occurs between the sensor electrode 21 and the shield electrode 22. Consequently, the capacitor Cs becomes electrically conductive and current flows through the ammeter A. Moreover, in the hands-on state in which no failure occurs, since the capacitor Cb is electrically conductive, current flows through the ammeter A. Therefore, when no failure occurs, the capacitance value is large in both the hands-off state and the hands-on state.

In the hands-off state in the sensor open mode, since the sensor electrode 21 and the sensor connector 130*a* are disconnected from each other, no current flows through the ammeter A. Similarly, in the hands-on state in the sensor open mode, no current flows through the ammeter A. Therefore, in the sensor open mode, the capacitance value is small in both the hands-off state and the hands-on state.

In the hands-off state in the shield open mode, when the first switch 13*a* is turned on to short-circuit the shield electrode 22 and the metal core 23, the shield electrode 22 is at GND potential. However, since the capacitance between the sensor electrode 21 and GND is smaller than the capacitance between the sensor electrode 21 and the shield electrode 22, no current flows through the ammeter A. Moreover, in the case of the hands-on state in the shield open mode, the capacitor Cb can be energized, so that current flows through the ammeter A. Therefore, in the shield open mode, the capacitance value in the hands-off state is small, while the capacitance value in the hands-on state is large.

In the sensor ground short mode, when the first switch 13*a* is turned on to short-circuit the shield electrode 22 and the metal core 23, the sensor electrode 21 is at GND potential, thus reducing the potential difference between both ends of the AC power supply Sa. Therefore, no current flows through the ammeter A in both the hands-on state and the hands-off state, such that the capacitance value is small in both the hands-off state and the hands-on state.

In the shield ground short circuit mode, when the first switch 13*a* is turned on, the connection state becomes the same as in a non-failure state in which the shield electrode 22 and the core metal 23 are short-circuited when the first switch 13*a* is turned on. Therefore, the capacitance value becomes large in both the hands-off state and the hands-on state.

In the sensor shield short-circuit mode, when the first switch 13*a* is turned on to short-circuit the shield electrode 22 and the metal core 23, the sensor electrode 21 is at GND potential, thus reducing the potential difference between both ends of the AC power supply Sa. Therefore, no current flows through the ammeter A in both the hands-on state and the hands-off state, such that the capacitance value is small in both the hands-off state and the hands-on state.

The control unit 11 determines that the capacitance value is small when the capacitance value acquired from the capacitance sensor 131 is less than the threshold value, while determining that the capacitance value is large when the capacitance value is the threshold value or higher. As depicted in FIG. 5, since a low capacitance value indicates one of the failure modes, the control unit 11 can determine the failure state when the capacitance value is low. Since the capacitance value is large in the hands-on state in the shield open mode but the capacitance value is small in the hands-off state, the control unit 11 can determine a failure due to the shield open mode when the shield is in the hands-off state. If failure determination is carried out when the driver does not grip the steering wheel 2, a failure due to the shield open mode can be determined, ensuring that there are no issues with failure determination in the shield open mode.

Moreover, the control unit 11 determines whether or not the mode is in the shield ground short mode when the second switch 13*b* is turned on. Specifically, the control unit 11 causes the voltage application circuit 132*a* to apply a voltage to the shield electrode 22 when the second switch 13*b* is turned on and the first switch 13*a* is turned off. The control unit 11 acquires the voltage value of the voltage applied to the shield electrode 22 from the voltmeter V. When the shield electrode 22 and the core metal 23 are short-circuited, the potential difference between both ends of the additional circuit 132 decreases, resulting in a lower voltage value measured by the voltmeter V. When the voltage value is smaller than the specified value, the control unit 11 determines that the failure state is caused by the shield ground short mode.

The control unit 11 determines whether or not the failure state is caused by the shield ground short mode based on the voltage value acquired from the voltmeter V when the second switch 13*b* is turned on. If the failure state is not caused by the shield ground short mode, the control unit 11 turns on the first switch 13*a* and determines whether or not the failure state is caused by a failure mode other than the shield ground short mode. As a result, the control unit 11 can determine all failure states caused by all failure modes without exception.

Figure 6:
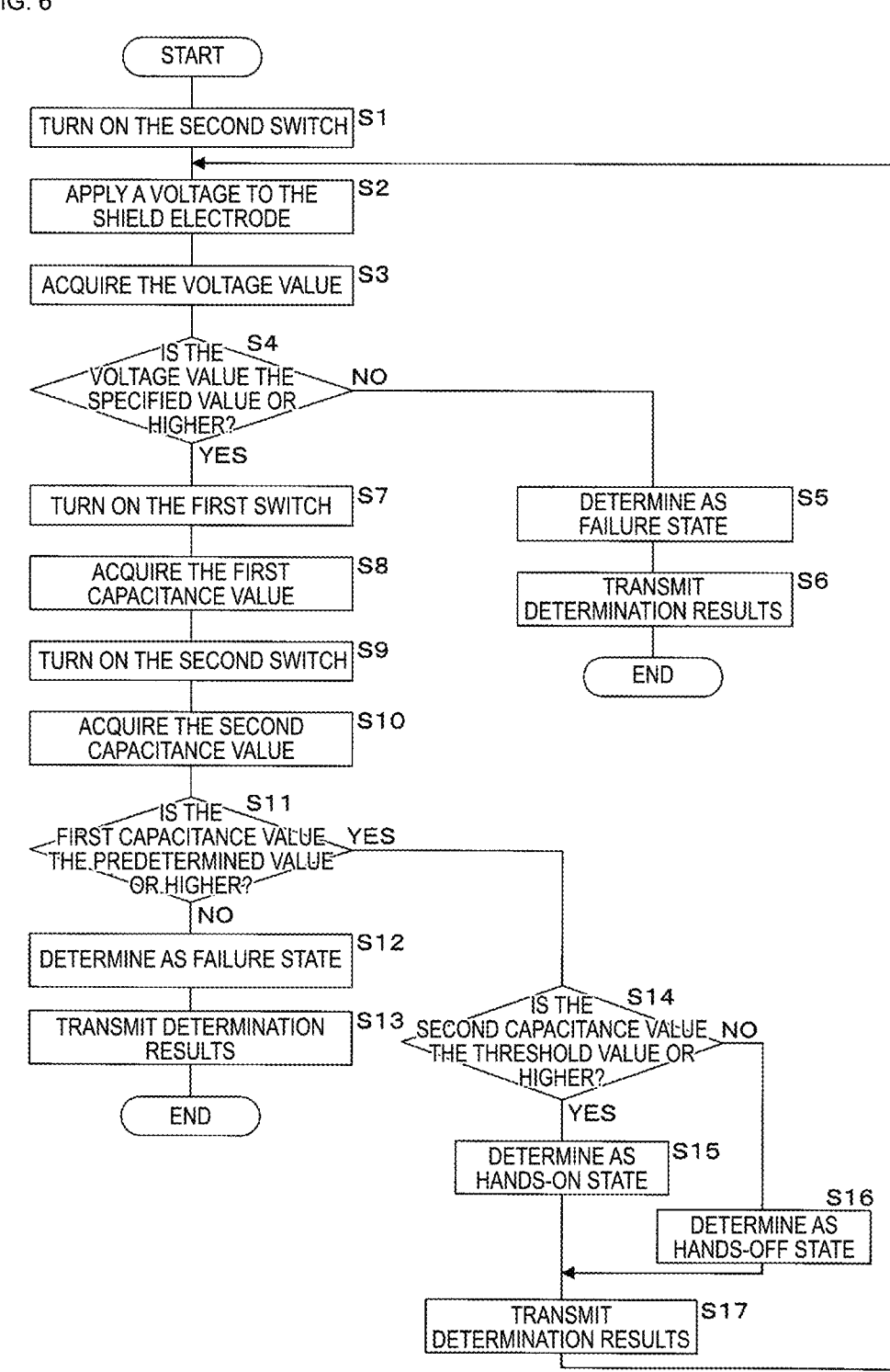
FIG. 6 is a flowchart depicting an example of the processing procedure of a control unit.

FIG. 6 is a flowchart depicting an example of the processing procedure of a control unit 11. In control unit 11, the processing in each of the following flowcharts may be executed by the control unit 11 in accordance with the program 121 stored in the storage unit 12 of the hands-on detection ECU 1, or may be achieved by a dedicated hardware circuit (for example, an FPGA or ASIC) provided in the control unit 11, or by a combination thereof. After detecting activation of the sensor electrode 21, for example, the control unit 11 of the hands-on detection ECU 1 repeatedly executes the following processing at prescribed or appropriate time intervals.

The control unit 11 turns on the second switch 13*b* (S1), causing the voltage application circuit 132*a* to apply a voltage to the shield electrode 22 (S2). The control unit 11 acquires the voltage value applied to the shield electrode 22 by the voltage application circuit 132*a* from the voltmeter V (S3). The control unit 11 determines whether or not the acquired voltage value is the specified value or higher (S4). If the voltage value is less than the specified value (S4: NO), it is determined that the shield electrode 22 and the metal core 23 are in a failure state (S5) and the determination results are transmitted to, for example, the driver assistance ECU6 (S6), at which point the process is ended.

If the voltage value is the specified value or higher (S4: YES), the control unit 11 turns on the first switch 13*a* (S7) and acquires a capacitance value (first capacitance value) from the capacitance sensor 131 (S8) while the shield electrode 22 and the metal core 23 are short-circuited. Moreover, the control unit 11 turns on the second switch 13*b* (S9) and acquires the second capacitance value from the capacitance sensor 131 (S10). The control unit 11 determines whether or not the first capacitance value is a predetermined value or higher (S11). If the first capacitance value is less than the predetermined value (S11: NO), the control unit 11 determines that there is a failure state (S12), and transmits the determination results to, for example, the driver assistance ECU6 (S13), at which point the process is ended.

If the first capacitance value is the predetermined value or higher (S11: YES), the control unit 11 determines whether or not the second capacitance value is a threshold value or higher related to hands-on determination (S14). If the second capacitance value is the threshold value or higher (S14: YES), the control unit 11 determines that the steering wheel 2 is in a hands-on state (S15). If the second capacitance value is less than the threshold value (S14: NO), the control unit 11 determines that the steering wheel 2 is in a non-hands-on state (S16). The control unit 11 transmits the determination results in S15 or S16 to, for example, the driver assistance ECU6 (S17) and returns the processing to S2.

The above-described configuration and processing makes it possible to determine a failure of the steering wheel 2 regardless of whether the steering wheel is gripped by the driver or not. Moreover, since the failure is determined based on the capacitance value at the time of the measurement and the variation width of the capacitance value over time need not be acquired, the failure can be determined in a short time. Moreover, switching the first switch 13*a* and the second switch 13*b* enables hands-on determination and failure determination with one circuit configuration, eliminating the need to provide a separate circuit or system for failure determination, and thereby reducing the production costs of the hands-on detection device. In addition, since hands-on determination and failure determination are repeatedly performed, erroneous hands-on determination due to the failure can be prevented.

When a reference code is noted in a claim, the reference code is merely provided as a reference in correspondence with the reference code described in the embodiment in order to facilitate understanding of the claim. The scope of claims is not limited by the reference code.

The embodiments presently disclosed are to be considered as examples for all points and are not restrictive. The technical features described in the examples can be combined with each other, with the scope of the invention intended to include all changes within the scope of the claims and the range equivalent to the scope of the claims. Furthermore, the independent and dependent claims set forth in the claims can be combined with each other in any and all combinations, regardless of the format of reference. Furthermore, while the claims are in a format in which a claim refers to two or more other claims (multiple claim format), the present invention is not limited to this format. A multiple claim (multi-multi claim) may be written using a format that cites at least one multiple claim.

EXPLANATION OF CODES

1 Hands-on detection ECU (hands-on detection device)
11 Control unit
13 Capacitance measuring circuit
13*a* First switch
13*b* Second switch
131 Capacitance sensor
132 Additional circuit
2 Steering wheel 21 Sensor electrode
22 Shield electrode
23 Core metal
In. Insulator

The invention claimed is:

1. A hands-on detection device of a steering wheel, comprising: a core metal; a shield electrode provided outside the core metal and separated by an insulator (In); a sensor electrode further provided outside the shield electrode and separated by an insulator; and a control unit configured to acquire the capacitance value of the sensor electrode in a state in which the shield electrode and the core metal are short-circuited, and determine whether or not there is a failure based on the capacitance value.

2. The hands-on detection device according to claim 1, further comprising a first switch provided between the shield electrode and the core metal, the first switch being turned on to short-circuit the shield electrode and the core metal, wherein the control unit determines whether or not there is a failure while the first switch is turned on.

3. The hands-on detection device according to claim 1, wherein the control unit determines that there is a failure state when the acquired capacitance value is less than a predetermined value.

4. The hands-on detection device according to claim 1, comprising an additional circuit which is connected to the shield electrode, applies a voltage to the shield electrode, and measures the voltage value of the applied voltage, wherein, when the voltage value of the voltage applied by the additional circuit is lower than a specified value, the control unit determines that the shield electrode and the core metal are in a short-circuited failure state.

5. The hands-on detection device according to claim 4, comprising a second switch provided between the shield electrode and the additional circuit which, when turned on, enables electrical conduction between the shield electrode and the additional circuit, wherein the control unit determines whether or not the shield electrode and the core metal are short-circuited when the second switch is turned on.

6. The hands-on detection device according to claim 5, wherein the control unit determines whether or not the steering wheel is gripped when the second switch is turned on.

7. A failure determination method for a hands-on detection device of a steering wheel, the device comprising: a core metal; a shield electrode provided outside the core metal and separated by an insulator (In); and a sensor electrode further provided outside the shield electrode and separated by an insulator, the method comprising: acquiring the capacitance value of the sensor electrode in a state in which the shield electrode and the core metal are short-circuited; and determining whether or not there is a failure based on the capacitance value.

8. A program for determining a failure of a hands-on detection device of a steering wheel, the device comprising: a core metal; a shield electrode provided outside the core metal and separated by an insulator; and a sensor electrode further provided outside the shield electrode and separated by an insulator, the program causing a computer to execute processing comprising: acquiring the capacitance value of the sensor electrode in a state in which the shield electrode and the core metal are short-circuited; and determining whether or not there is a failure based on the capacitance value.

* * * * *